United States Patent
Hu et al.

(10) Patent No.: US 10,892,274 B2
(45) Date of Patent: Jan. 12, 2021

(54) THREE-DIMENSIONAL MEMORY DEVICES AND FABRICATING METHODS THEREOF

(71) Applicant: Yangtze Memory Technologies Co., Ltd., Hubei (CN)

(72) Inventors: Yushi Hu, Hubei (CN); Qian Tao, Hubei (CN); Haohao Yang, Hubei (CN); Jin Wen Dong, Hubei (CN); Jun Chen, Hubei (CN); Zhenyu Lu, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

(21) Appl. No.: 16/163,265

(22) Filed: Oct. 17, 2018

(65) Prior Publication Data
US 2019/0139982 A1  May 9, 2019

Related U.S. Application Data

(63) Continuation of application No. PCT/CN2018/104457, filed on Sep. 7, 2018.

(30) Foreign Application Priority Data

Nov. 9, 2017  (CN) .......................... 2017 1 1098604

(51) Int. Cl.
*H01L 27/11582* (2017.01)
*H01L 27/1157* (2017.01)

(52) U.S. Cl.
CPC .... *H01L 27/11582* (2013.01); *H01L 27/1157* (2013.01)

(58) Field of Classification Search
CPC ....................... H01L 27/11582; H01L 27/1157
(Continued)

(56) References Cited

U.S. PATENT DOCUMENTS 9,929,177 B2  3/2018  Nagumo
2008/0149913 A1*  6/2008  Tanaka ................ H01L 27/2454
257/5
(Continued)

FOREIGN PATENT DOCUMENTS

CN  104425504 A  3/2015
CN  105810640 A  7/2016
(Continued)

OTHER PUBLICATIONS

Machine English Translation of Chinese Patent No. CN 105810640 (Year: 2016).*

(Continued)

*Primary Examiner* — Dzung Tran
(74) *Attorney, Agent, or Firm* — Sterne, Kessler, Goldstein & Fox P.L.L.C.

(57) ABSTRACT

Embodiments of 3D memory devices and fabricating methods are disclosed. The method can comprise: forming an alternating dielectric stack on a substrate; forming a channel hole penetrating the alternating dielectric stack to expose a surface of the substrate; forming an epitaxial layer on a bottom of the channel hole; forming a functional layer covering a sidewall of the channel hole and a top surface of the epitaxial layer; forming a protecting layer covering the functional layer; removing portions of the functional layer and the protecting layer to form an opening to expose a surface of the epitaxial layer; expanding the opening laterally to increase an exposed area of the epitaxial layer at the bottom of the channel hole; and forming a channel structure on the sidewall of the channel hole and being in electrical contact with the epitaxial layer through the expanded opening.

13 Claims, 10 Drawing Sheets

(58) Field of Classification Search
USPC .......................................................... 257/314
See application file for complete search history.

(56) References Cited

U.S. PATENT DOCUMENTS

| | | | |
|---|---|---|---|
| 2008/0173932 A1* | 7/2008 | Kidoh | ................ H01L 27/11568 257/324 |
| 2008/0239818 A1* | 10/2008 | Mokhlesi | .......... H01L 27/11568 365/185.17 |
| 2009/0283819 A1* | 11/2009 | Ishikawa | ........... H01L 27/11578 257/324 |
| 2010/0184288 A1 | 7/2010 | Park et al. | |
| 2013/0134492 A1* | 5/2013 | Yang | ................... H01L 27/1157 257/314 |
| 2013/0270625 A1 | 10/2013 | Jang et al. | |
| 2015/0069492 A1 | 3/2015 | Fujii | |
| 2016/0181272 A1* | 6/2016 | Rabkin | ............. H01L 21/02653 438/268 |
| 2016/0268276 A1 | 9/2016 | Iino | |
| 2017/0110470 A1 | 4/2017 | Rabkin et al. | |
| 2017/0243886 A1 | 8/2017 | Lee et al. | |

FOREIGN PATENT DOCUMENTS

| | | | |
|---|---|---|---|
| CN | 107305894 A | | 10/2017 |
| CN | 107871744 A | | 4/2018 |
| WO | WO-2019/091200 A1 | | 5/2019 |

OTHER PUBLICATIONS

International Search Report and Written Opinion of the International Searching Authority directed to related international Patent Application No. PCT/CN2018/104457, dated Dec. 3, 2018; 8 pages.

\* cited by examiner

THREE-DIMENSIONAL MEMORY DEVICES AND FABRICATING METHODS THEREOF

CROSS-REFERENCE TO RELATED APPLICATIONS

This application claims priority to Chinese Patent Application No. 201711098604.4, filed on Nov. 9, 2017, and PCT Application No. PCT/CN2018/104457, filed on Sep. 7, 2018, which are incorporated herein by reference in their entireties.

TECHNICAL FIELD

The present disclosure generally relates to the field of semiconductor technology, and more particularly, to three-dimensional (3D) memory devices and fabricating methods thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

As semiconductor technology advances, 3D memory devices, such as 3D NAND memory devices, keep scaling more oxide/nitride (ON) layers. As a result, etching processes of channel holes become more and more challenging.

BRIEF SUMMARY

Embodiments of a method for forming a three-dimensional (3D) memory device are disclosed herein.

Disclosed is a method for forming a three-dimensional (3D) memory device. The method comprises: forming an alternating dielectric stack on a substrate; forming a channel hole penetrating the alternating dielectric stack to expose a surface of the substrate; forming an epitaxial layer on a bottom of the channel hole; forming a functional layer covering a sidewall of the channel hole and a top surface of the epitaxial layer; forming a protecting layer covering the functional layer; removing portions of the functional layer and the protecting layer to form an opening to expose a surface of the epitaxial layer; expanding the opening laterally to increase an exposed area of the epitaxial layer at the bottom of the channel hole; and forming a channel structure on the sidewall of the channel hole and being in electrical contact with the epitaxial layer through the expanded opening.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer. In some embodiments, forming the alternating dielectric stack comprises: forming at least 32 dielectric layer pairs stacked in a vertical direction, wherein each dielectric layer pair includes a silicon oxide layer and a silicon nitride layer.

In some embodiments, forming the functional layer comprises: forming a barrier layer on the sidewall of the channel hole to block an outflow of electronic charges during operation; forming a storage layer on a surface of the barrier layer to store electronic charges during operation; and forming a tunneling layer on a surface of the storage layer to tunnel electronic charges during operation.

In some embodiments, forming the protecting layer comprises: forming a first channel layer covering the functional layer; and forming a mask layer covering the first channel structure.

In some embodiments, removing the portions of the functional layer and the protecting layer to form the opening comprises: performing a punch etch to remove the portions of the functional layer and the protecting layer that are laterally extending on a top surface of the epitaxial layer. In some embodiments, performing the punch etch comprises: removing a portion of the epitaxial layer to form a recess.

In some embodiments, expanding the opening laterally comprises: performing a wet etch to further remove a portion of the functional layer that is laterally extending on a top surface of the epitaxial layer, such that a first diameter of the expanded opening is larger than a second diameter of the recess in the epitaxial layer.

In some embodiments, expanding the opening laterally further comprises: removing the mask layer during the wet etch while keeping the first channel layer.

In some embodiments, the method further comprises: before forming the channel structure, removing the protecting layer.

In some embodiments, forming the channel structure comprises: forming a second channel layer on the first channel layer and fill the expanded opening and the recess, wherein the channel structure includes the first channel layer and the second channel layer.

In some embodiments, the method further comprises: replacing the second dielectric layers in the alternating dielectric stack with conductor layers.

Another aspect of the present disclosure provides a three-dimensional (3D) memory device, comprising: an alternating conductor/dielectric stack on a substrate; a channel hole penetrating the alternating dielectric stack; an epitaxial layer on a bottom of the channel hole and in contact with the substrate; a functional layer covering a sidewall of the channel hole; and a channel structure covering the functional layer, and being in electrical contact with the epitaxial layer through a top surface of the epitaxial layer as well as a sidewall and a bottom surface of a recess in the epitaxial layer.

In some embodiments, the alternating conductor/dielectric stack comprises: at least 32 conductor/dielectric layer pairs stacked in a vertical direction, wherein each conductor/dielectric layer pair includes a conductor layer and a dielectric layer. In some embodiments, the alternating conductor/dielectric stack comprises: at least 32 conductor/dielectric layer pairs stacked in a vertical direction, wherein each conductor/dielectric layer pair includes a tungsten layer and a silicon oxide layer.

In some embodiments, the functional layer comprises: a barrier layer on the sidewall of the channel hole configured to block an outflow of electronic charges; a storage layer on a surface of the barrier layer configured to store electronic charges during operation of the 3D memory device; and a tunneling layer on a surface of the storage layer configured to tunnel electronic charges.

In some embodiments, the channel structure comprises: a first channel layer covering the functional layer; and a second channel layer covering the first channel structure and being in electric contact with the epitaxial layer. In some embodiments, a material of the first channel layer is different from a material of the second channel layer.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
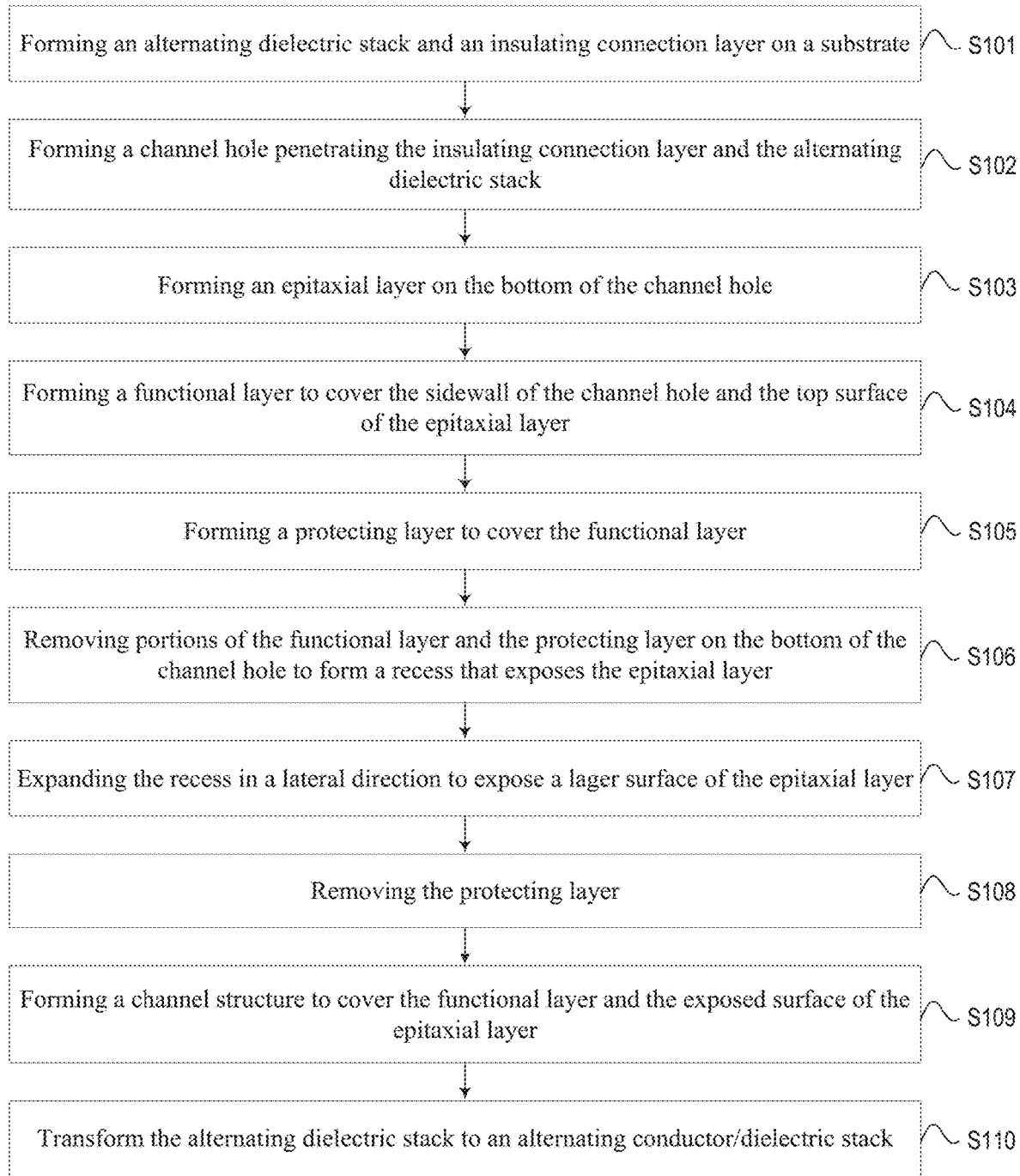
FIG. 1 illustrates a flow diagram of an exemplary method for forming a 3D memory in accordance with some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

It is noted that, in some existing process flows, when forming a channel structure in each channel hole to form a vertically-oriented string of memory cell transistors, portions of a functional layer and a protecting layer (e.g., a silicon/oxide/nitride/oxide (SONO) stack) at the bottom of the channel hole is removed by using a dry etch process (this process is referred to as "a punch etch") to make an electrical connection. However, due to the thickness of the SONO stack and the small critical dimension of the channel hole, the punch etch forms a small window (e.g., a "punch window") and is susceptible to under etch issues. Due to the small opening after the punch etch, the contact area between the channel structure and an epitaxial layer below the channel hole is limited and can cause high contact resistance.

Accordingly, various embodiments in accordance with the present disclosure provide 3D memory devices and fabricating methods thereof to enlarge the etch window and reduce punch etch issues, and to improve the electrical contact between the channel structure and an epitaxial layer. In some embodiments, in the disclosed method, after the punch etch, an additional wet etch is added to open up the small punch window. The wet etch process is capable of etching SiOx/SiON/SiNx and be selective to silicon so that the channel structure and the epitaxial layer will not be etched (i.e., they are both protected). The wet etch process can be controlled to laterally expand the punch opening to enlarge the contact window between the channel structure and the epitaxial layer. As such, the disclosed method can ensure an enlarged contact area between the channel structure and the epitaxial layer to improve electrical connection. Further, the under punch issue can be mitigated by opening up the small punch window with the wet etch chemistry.

Referring to FIG. 1, a flow diagram of an exemplary method for forming a 3D memory device is shown in accordance with some embodiments of the present disclosure. FIGS. 2A-2I illustrate cross-sectional views of an exemplary 3D memory device at certain fabricating stages of the method shown in FIG. 1.

As shown in FIG. 1, the method can start at operation S101, in which an alternating dielectric stack and an insulating connection layer can be formed on the surface of a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc. In some embodiments, a doped region (not shown in figures) can be formed on the substrate by using any suitable implantation and/or diffusion process.

Figure 2A:
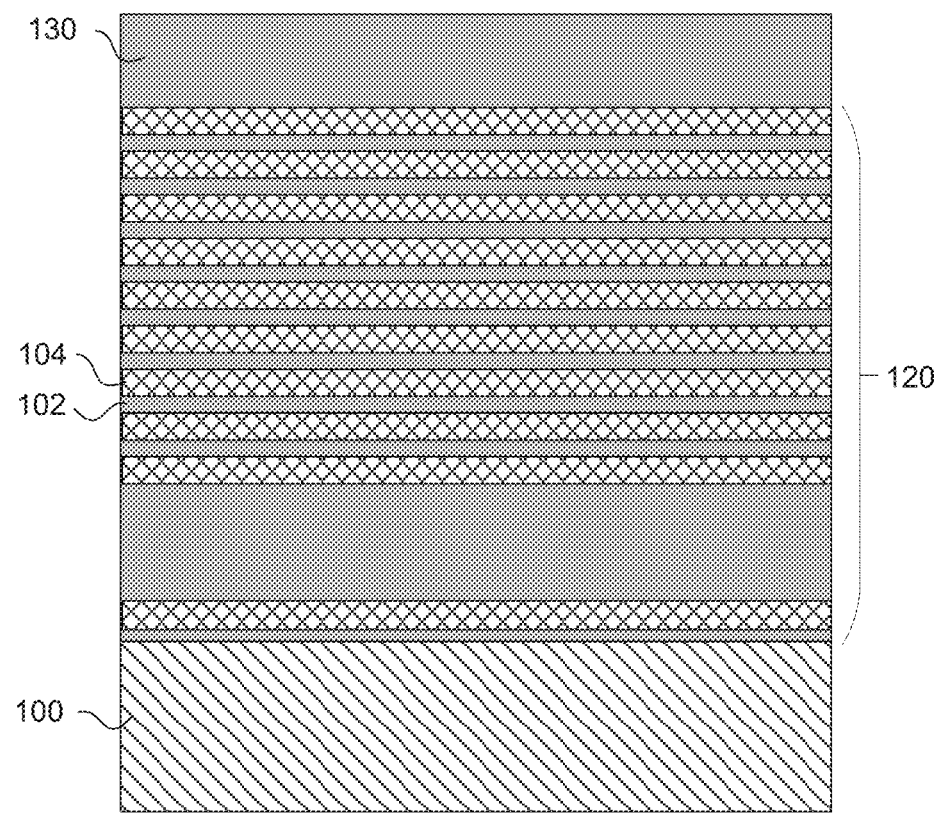
FIGS. 2A-2I illustrate cross-sectional views of an exemplary 3D memory device at certain fabricating stages of the method shown in FIG. 1 in accordance with some embodiments of the present disclosure.

As shown in FIG. 2A, the alternating dielectric stack 120 including a plurality of dielectric layer pairs can be formed on the substrate 100. The alternating dielectric stack 120 can include an alternating stack of a first dielectric layer 102 (e.g., of silicon oxide) and a second dielectric layer 104 (e.g., of silicon nitride) that is different from first dielectric layer. In some embodiments, the second dielectric layers 104 are to be replaced by conductive layers in subsequent processes, so they are also referred as sacrificial layers.

The plurality of first dielectric layers 102 and second dielectric layers 104 are extended in a lateral direction that is parallel to a surface of the substrate 100. In some embodiments, there are more layers than the dielectric layer pairs made of different materials and with different thicknesses in the alternating dielectric stack 120. The alternating dielectric stack 120 can be formed by one or more thin film deposition processes including, but not limited to, Chemical Vapor Deposition (CVD), Physical Vapor Deposition (PVD), Atomic Layer Deposition (ALD), or any combination thereof.

In some embodiments, the alternating dielectric stack 120 can include a plurality of oxide/nitride layer pairs. Each dielectric layer pair includes a layer of silicon oxide 102 and a layer of silicon nitride 104. The plurality of oxide/nitride layer pairs are also referred to herein as an "alternating oxide/nitride stack." That is, in the alternating dielectric stack 120, multiple oxide layers 102 (shown in the areas with dotes) and multiple nitride layers 104 (shown in the areas with meshes) alternate in a vertical direction. In other words, except a top and a bottom layer of a given alternating oxide/nitride stack, each of the other oxide layers 102 can be sandwiched by two adjacent nitride layers 104, and each of the nitride layers 104 can be sandwiched by two adjacent oxide layers 102.

Oxide layers can each have the same thickness or have different thicknesses. For example, a thickness of each oxide layer can be in a range from about 5 nm to about 150 nm. Similarly, nitride layers can each have the same thickness or have different thicknesses. For example, a thickness of each nitride layer can be in a range from about 5 nm to about 200 nm. In some embodiments, a top oxide layer and/or a bottom oxide layer can have a larger thickness compared to the thickness of middle oxide layers.

It is noted that, in the present disclosure, the oxide layers 102 and/or nitride layers 104 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 120 can include any suitable number of layers of the oxide layers 102 and the nitride layers 104. In some embodiments, a total number of layers of the oxide layers 102 and the nitride layers 104 in the alternating dielectric stack 120 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair.

The insulating connection layer 130 can be formed on the alternating dielectric stack 120. In some embodiments, the insulating connection layer 130 can be made by any suitable insulating material and/or dielectric material, such as silicon oxide. It is noted that, the material of the insulating connection layer 130 can be different from the material of the nitride layer in the alternating dielectric stack 120. The insulating connection layer 130 can be formed on the top surface of the alternating dielectric stack 120. In some embodiments, a thickness of the insulating connection layer 130 can be in a range from about 50 nm to about 150 nm.

In some embodiments, the alternating dielectric stack 120 and the insulating connection layer 130 can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Figure 2B:
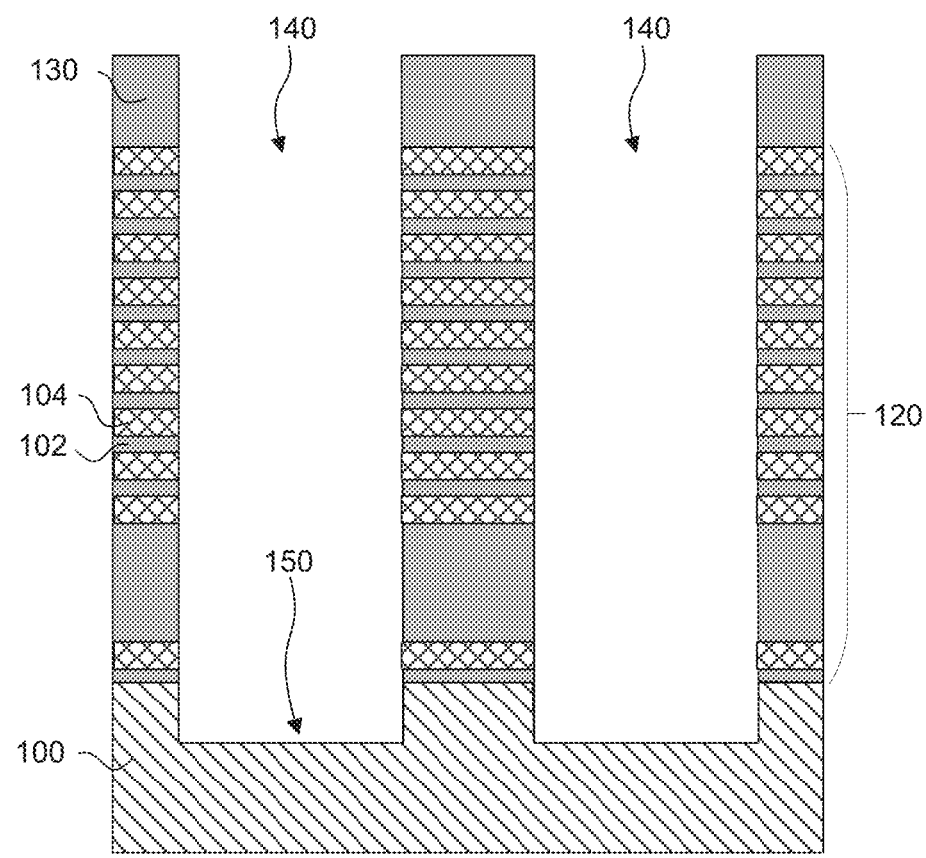

Referring back to FIG. 1, the method can process to operation S102, in which multiple channel holes 140 can be formed. As shown in FIG. 2B, each channel hole 140 can completely penetrate the alternating dielectric stack 120 and the insulating connection layer 130, and can extend into the surface of the substrate 100 to form a first recess 150. In some embodiments, the multiple channel holes 140 can be formed by photoresist patterning and etching the alternating dielectric stack 120 and the insulating connection layer 130, and a subsequent ashing process and cleaning process. The etching process to form the multiple channel holes 140 can be a wet etching, a dry etching, or a combination thereof. The ashing process can be a plasma ashing, and the cleaning process can be a wet cleaning, as would be apparent to person of ordinary skill in the art in view of the present disclosure.

Figure 2C:
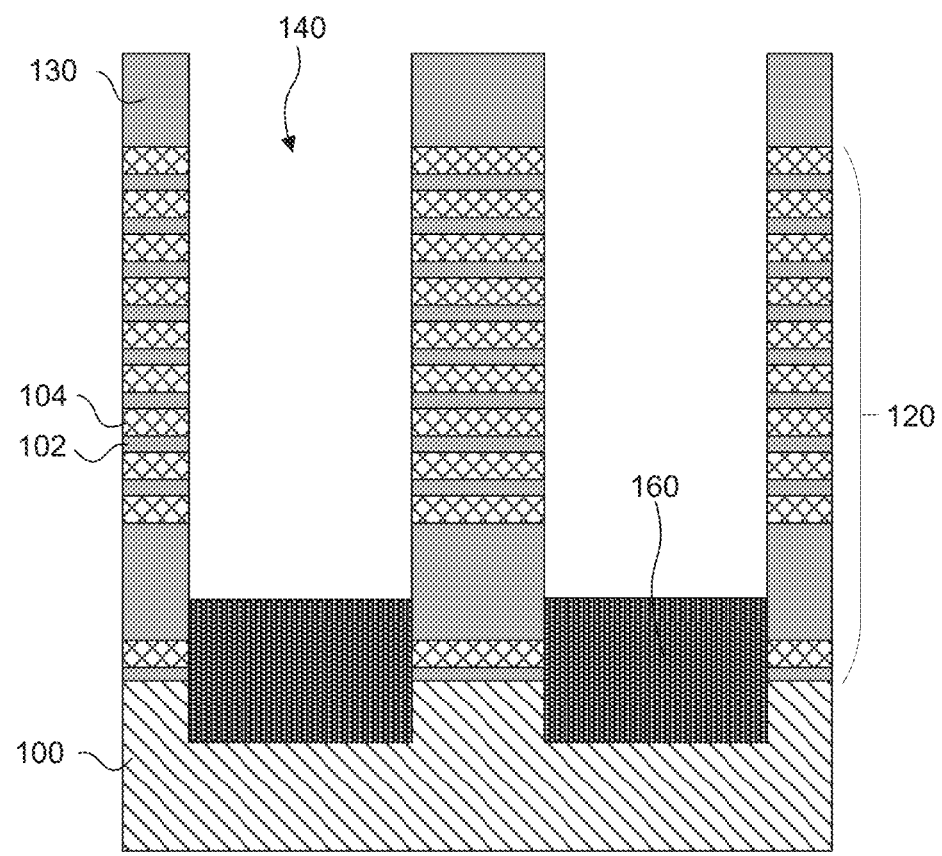

Referring back to FIG. 1, the method can process to operation S103, in which an epitaxial layer 160 can be formed in the first recess 150 in each channel hole 140, as shown in FIG. 2C. In some embodiments, the epitaxial layer 160 can be a polycrystalline silicon (polysilicon) layer formed by using a selective epitaxial growth (SEG) process. For example, an SEG pre-clean process can be performed to clean the multiple channel holes 140. A following deposition process can be performed to form a polysilicon layer in the first recess 150 in each channel hole 140. In some embodiments, any suitable doping process, such as an ion metal plasma (IMP) process, can be performed on the polysilicon layer to form the epitaxial layer 160. In some embodiments, the epitaxial layer 160 cannot directly formed on the surface of the substrate 100. One or more layers can be formed between the epitaxial layer 160 and the substrate 100. That is, the epitaxial layer 160 is overlay the substrate 100.

Figure 2D:
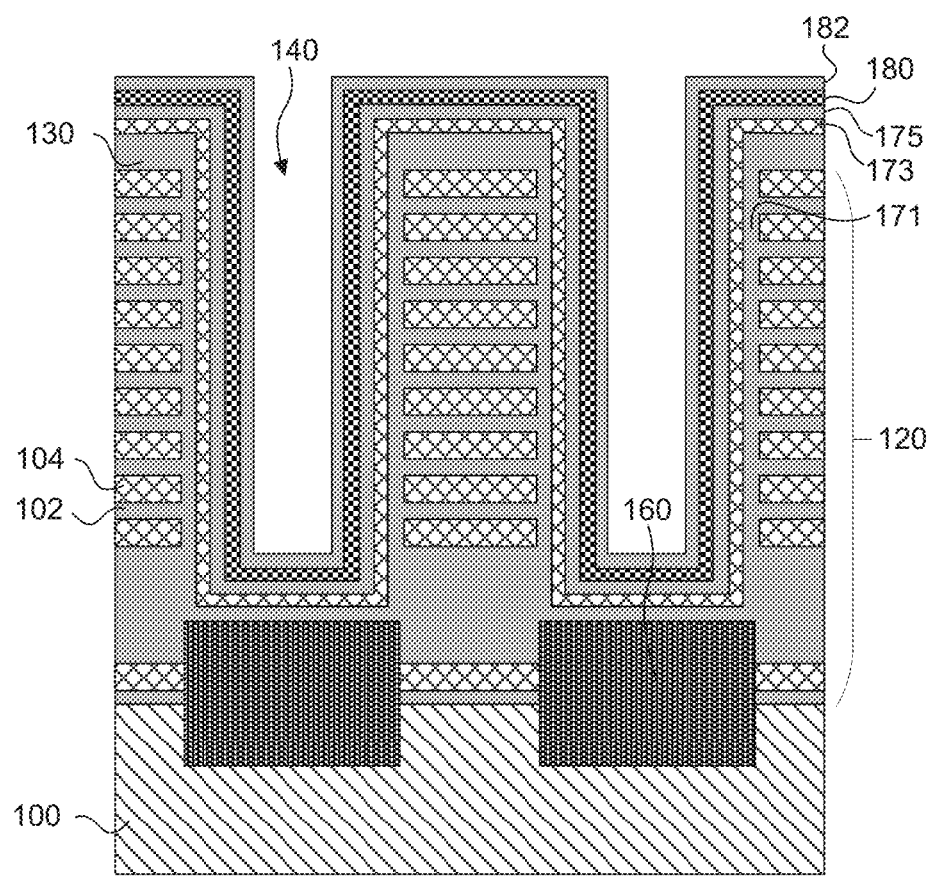

Referring back to FIG. 1, the method can process to operation S104, in which a functional layer can be formed to cover the sidewall of each channel hole 140 and the top surface of the epitaxial layer 160 in each channel hole 140. As shown in FIG. 2D, the functional layer can include a barrier layer 171, a storage layer 173, and a tunneling layer 175. The functional layer can also cover the top surface of the insulating connection layer 130. In some embodiments, the functional layer can also be referred to a charge trapping layer.

The barrier layer 171 can be formed on the sidewall of each channel hole 140 and the top surface of the epitaxial layer 6 in each channel hole 140. The barrier layer 171 can be used for blocking the outflow of the electronic charges. In some embodiments, the barrier layer 171 can be a silicon oxide layer or a combination of silicon oxide/silicon nitride/silicon oxide (ONO) layers. In some embodiments, the barrier layer 171 includes high dielectric constant (high-k) dielectrics (e.g., aluminum oxide). In one example, the barrier layer 171 is an oxide layer formed by using a deposition process. In some embodiments, a thickness of the barrier layer 171 can be in a range from about 4 nm to about 15 nm.

The storage layer 173 can be formed on the surface of the barrier layer 171. The storage layer 173 can be used for storing electronic charges. The storage or removal of charge in the storage layer 173 can impact the on/off state and/or a conductance of the semiconductor channel. The storage layer 173 can include polycrystalline silicon (polysilicon) or silicon nitride. The storage layer 173 can include one or more films of materials including, but are not limited to, silicon nitride, silicon oxynitride, a combination of silicon oxide and silicon nitride, or any combination thereof. In some embodiments, the storage layer 173 can include a nitride layer formed by using one or more deposition processes. In some embodiments, a thickness of the storage layer 173 can be in a range from about 3 nm to about 15 nm.

The tunneling layer 175 can be formed on the surface of the storage layer 174. The tunneling layer 175 can be used for generating electronic charges (electrons or holes). The tunneling layer 175 can include dielectric materials including, but not limited to, silicon oxide, silicon nitride, silicon oxynitride, or any combination thereof. In some embodiments, the tunneling layer 175 can be an oxide layer formed by using a deposition process. In some embodiments, a thickness of the tunneling layer 175 can be in a range from about 5 nm to about 15 nm.

Referring back to FIG. 1, the method can process to operation S105, in which a protecting layer can be formed to cover the functional layer. As shown in FIG. 2D, the protecting layer can include a first channel layer 180 covering the functional layer, and a mask layer 182 covering the first channel layer 180. In some embodiments, the first channel layer 180 can include amorphous silicon, polycrystalline silicon, and/or monocrystalline silicon. The first channel layer 180 can be formed by using a thin film deposition process, such as ALD, CVD, PVD, or any other suitable process. In some embodiments, a thickness of the first channel layer 180 can be in a range from about 5 nm to about 20 nm.

In some embodiments, a mask layer 182 can be formed to cover the first channel layer 180 to protect the first channel layer 180 from being damaged in a subsequent removal process. In some embodiments, the mask layer 182 can be a silicon oxide layer formed by using a thin film deposition process, such as ALD, CVD, PVD, or any other suitable process. In some embodiments, a thickness of the mask layer 182 can be in a range from about 5 nm to about 20 nm.

Figure 2E:
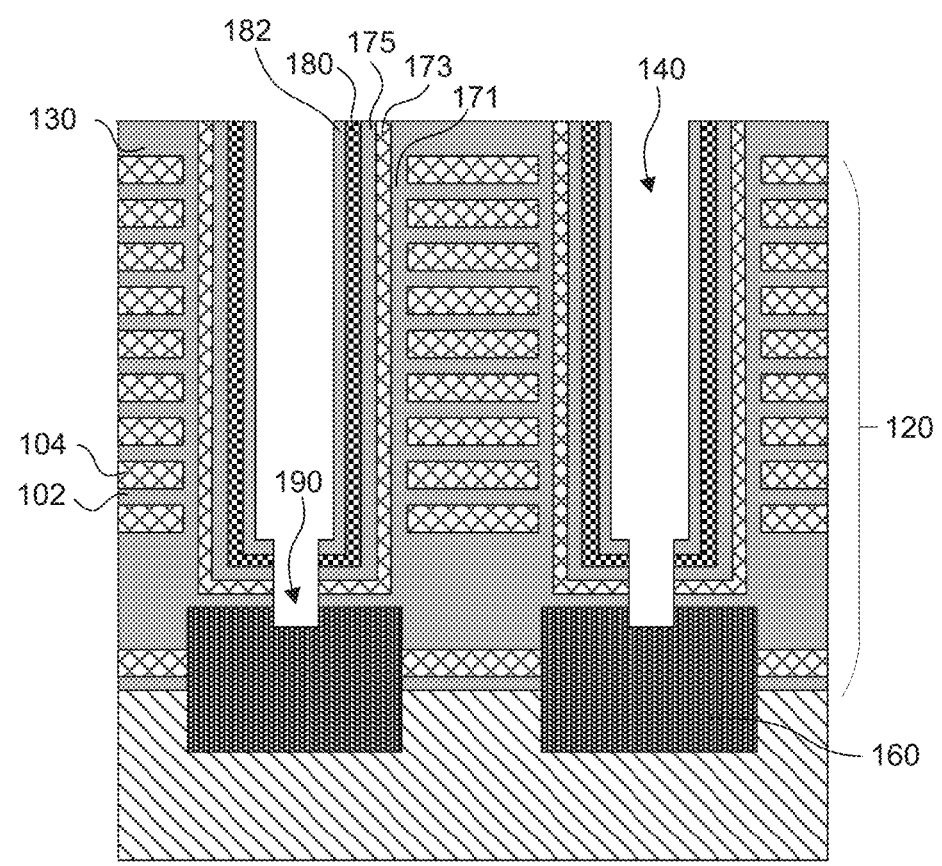

Referring back to FIG. 1, the method can process to operation S106, in which portions of the functional layer and the protecting layer on the bottom of each channel hole 140 can be removed to form a second recess 190 that exposes or extends into the epitaxial layer 160. In some embodiments, as shown in FIG. 2E, the portions of the functional layer and the protecting layer that are located on the top surface of the epitaxial layer 160 and at the bottom of each channel hole 140 can be removed by any suitable etching process. As such, the formed second recess 190 can extend into the epitaxial layer 160 in each channel hole 140. The axial section of the formed functional layer can be two opposing L-shapes.

In some embodiments, the etching process can include a dry etch (e.g., a punch etch) and/or a wet etch. In some embodiment, in the same etching process, portions of the functional layer, the protecting layer, and the insulating connection layer 130 in a top portion of the 3D memory device can also be removed. A following chemical mechanical polishing (CMP) process can be performed to planarize the top surface of the insulating connection layer 130, as shown in FIG. 2E. In some embodiments, in the same etching process, an exposed portion of the mask layer 182 can also be partially removed.

Figure 2F:
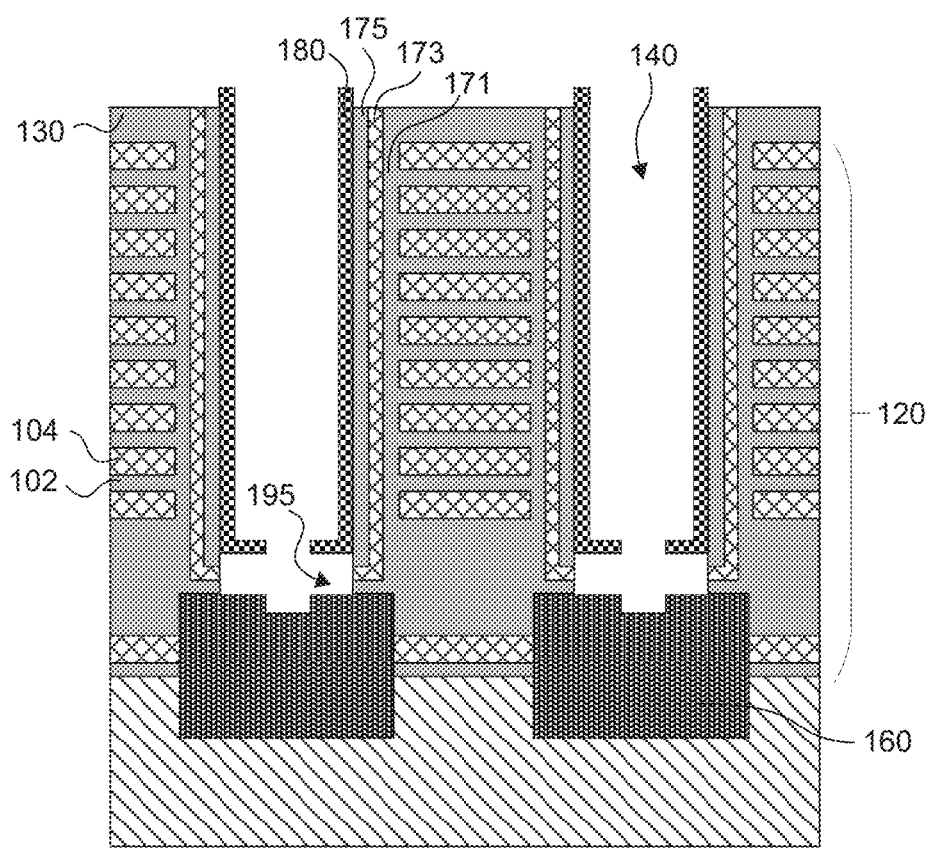

Referring back to FIG. 1, the method can process to operation S107, in which the second recess 190 can be laterally expanded to expose a lager surface of the epitaxial layer 160. In some embodiments, as shown in FIG. 2F, the portion of the functional layer below the protecting layer can be removed by any suitable wet etching process, such that the second recess 190 can be laterally expanded to opening 195 that exposes a lager top surface of the epitaxial layer 160. The formed opening 195 can ensure an enlarged contact window between the epitaxial layer 160 and a channel structure formed in a subsequent process.

In some embodiments, the wet etching process can be able to etch the functional layer (e.g., SiOx/SiON/SiNx) and be selective to silicon so that the first channel layer 180 and the epitaxial layer 160 can be both protected. The wet etching process can be controlled to laterally expand the second recess 190 to form opening 195 that exposes a lager top surface of the epitaxial layer 160. As shown in FIG. 2F, a lateral diameter of opening 195 is larger than a diameter of the second recess 190 in the epitaxial layer 160, and is larger than an aperture of the channel hole 140 that include the functional layer and protecting layer on its sidewall. The axial section of the remaining functional layer can be two opposing I-shapes.

In some embodiments, the mask layer 182 can be partially or completely removed in the same wet etching process. The mask layer 182 can protect the first channel layer 180 from being damaged in the wet etching process. Further, portions of the functional layer and the insulating connection layer 130 in a top portion of the 3D memory device can be removed in the same wet etching process, as shown in FIG. 2F.

Referring back to FIG. 1, the method can process to operation S108, in which the protecting layer can be completely or partially removed. In some embodiments, the process of removing the protecting layer can include grinding, dry etching, wet etching, or chemical mechanical polishing, or a combination thereof. As such, the remaining mask layer 182 can be completely removed.

Figure 2G:
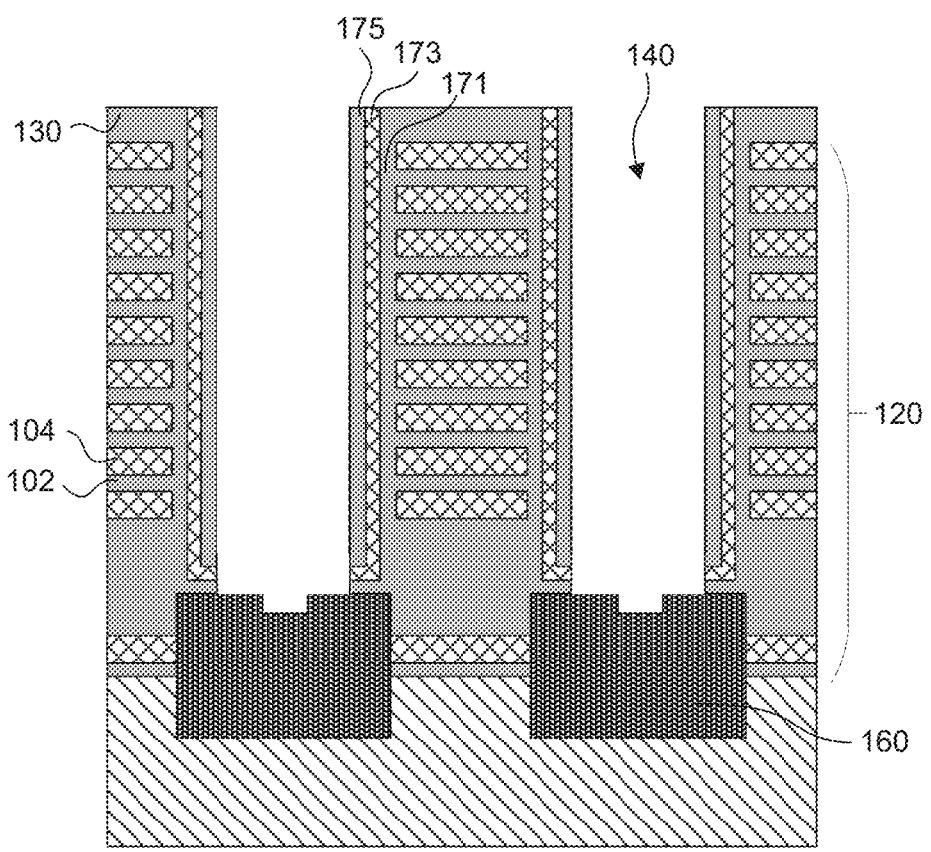

In some embodiments, as shown in FIG. 2G, the first channel layer 180 can be completely removed. In some other embodiments, the first channel layer 180 can be partially removed. For example, a lower portion of the first channel layer 180 can be removed to facilitate a subsequent deposition process. The remaining portion of the first channel layer 180 can be used as a portion of the channel structure formed in a subsequent process. In some other embodiments, if the mask layer 182 has been completely removed in the operation S107, the operation S108 can be omitted to simplify process steps.

Figure 2H:
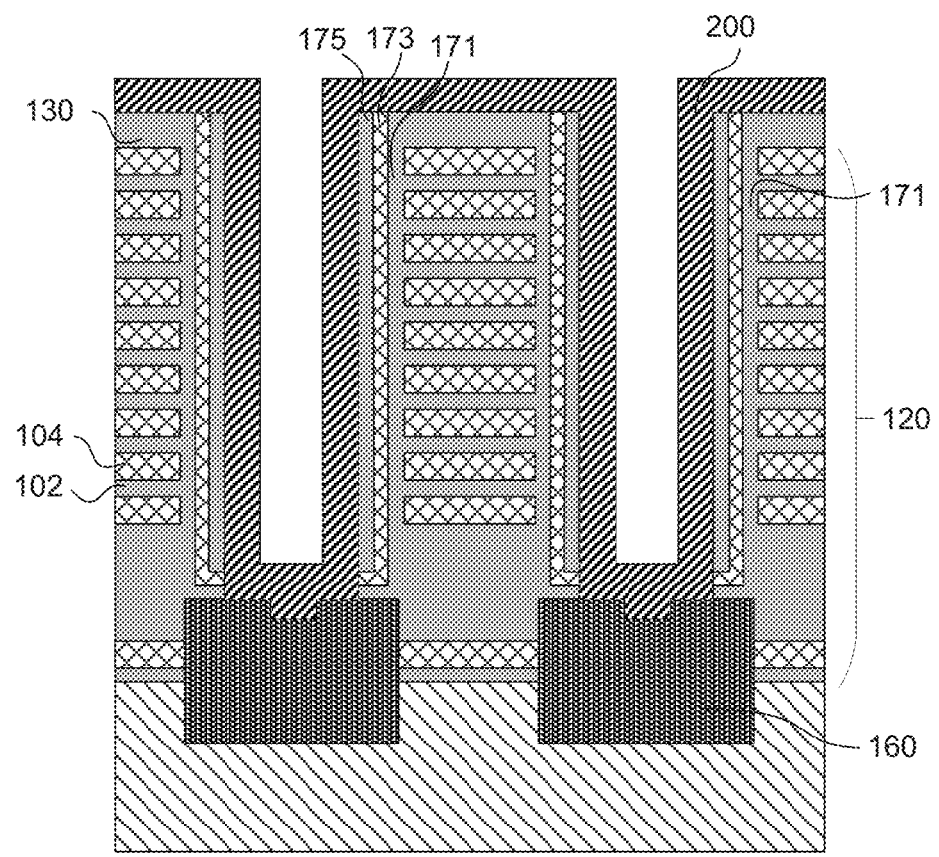
Figure 2I:
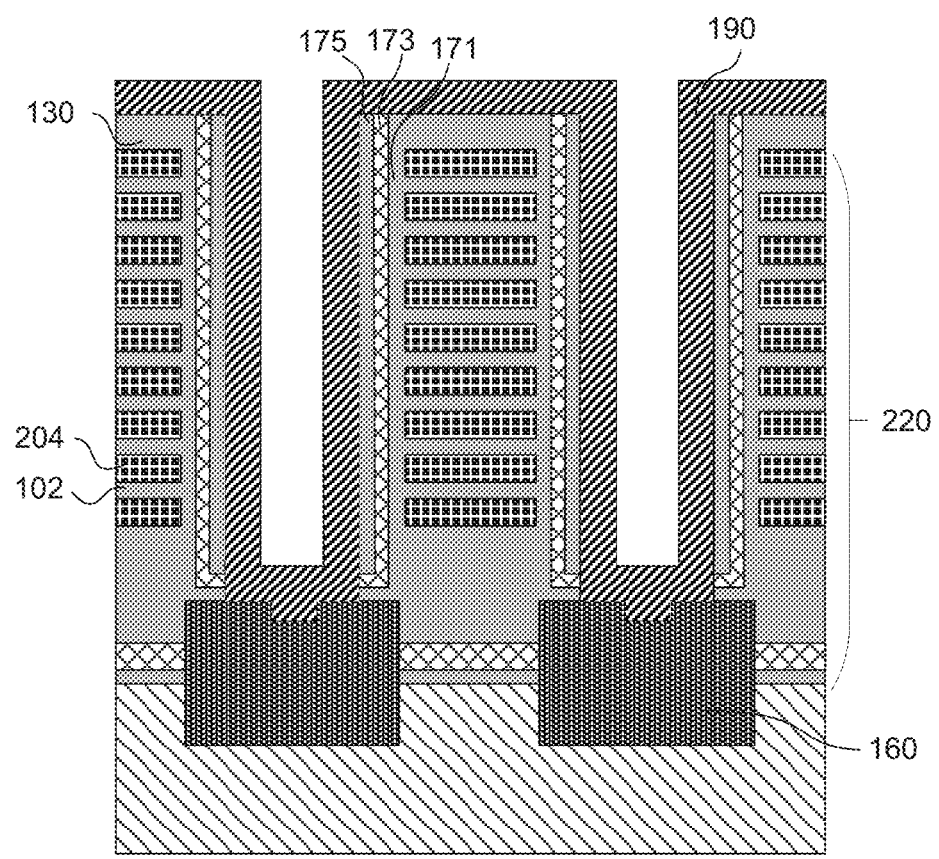

Referring back to FIG. 1, the method can process to operation S109, in which a channel structure 200 is formed to cover the functional layer and the exposed surface of the epitaxial layer 160 in each channel hole 140. As shown in FIG. 2H, the formed channel structure 200 can cover the epitaxial layer 160 and the functional layer on sidewall of the channel hole 140. The channel structure 200 can be electrically connected to the epitaxial layer 160.

In some embodiments, if the first channel layer 180 is completely removed in operation S108, the channel structure can be a semiconductor layer formed covering the functional lay and the exposed surface of the epitaxial layer 160 by any suitable thin film deposition processes including, but not limited to, chemical vapor deposition (CVD), physical vapor deposition. (PVD) or atomic layer deposition (ALD), or a combination thereof. In some other embodiments, if the first channel layer 180 is not completely removed in operation S108. And the channel structure can include the first channel layer 180 and a second channel layer formed covering the first channel layer 180 and the exposed surface of the epitaxial layer 160. In some embodiments, the first channel layer 180 and a second channel layer can have a same semiconductor material or different semiconductor materials.

The channel structure 200 is electrically connected to the epitaxial layer 160 through the opening 195 and the second recess 190, thus has an enlarged contact area with the epitaxial layer 160. Therefore, the corresponding contact resistance can be remarkably reduced, and a good electrical connection between the channel structure 200 and the epitaxial layer 160 can be achieved.

Referring back to FIG. 1, the method can process to operation S110, in which a gate replacement process (also known as the "word line replacement" process) can be performed to replace the second dielectric layers 104 (e.g., silicon nitride) of the alternating dielectric stack 120 with conductor layers 204 (e.g., W or other metal). As shown in FIG. 3I, after the gate replacement process, the alternating dielectric stack 120 can become alternating conductor/dielectric stack 220.

The replacement of second dielectric layers 104 with conductor layers 204 can be performed by wet etching second dielectric layers 104 (e.g., silicon nitride) selective to the first dielectric layers (e.g., silicon oxide) and filling the structure with conductor material (e.g., W). The conductor layers 204 can be formed by PVD, CVD, ALD, any other suitable process, or any combination thereof. The conductor layers 204 can include conductive materials including, but not limited to, W, Co, Cu, Al, polysilicon, silicides, or any combination thereof.

Accordingly, 3D memory devices and fabricating methods thereof are disclosed. By adding a wet etch after the punch etch, the small punch window can be laterally expanded to expose more surface of the epitaxial layer. As such, an enlarged contact area between the channel structure and the epitaxial layer can be ensured to improve the electrical connection. Further, the under punch issue can be mitigated by opening up the small punch window with the wet etch chemistry.

One aspect of the present discloses a method for forming a three-dimensional (3D) memory device. The method comprises: forming an alternating dielectric stack on a substrate; forming a channel hole penetrating the alternating dielectric stack to expose a surface of the substrate; forming an epitaxial layer on a bottom of the channel hole; forming a functional layer covering a sidewall of the channel hole and a top surface of the epitaxial layer; forming a protecting layer covering the functional layer; removing portions of the functional layer and the protecting layer to form an opening to expose a surface of the epitaxial layer; expanding the opening laterally to increase an exposed area of the epitaxial layer at the bottom of the channel hole; and forming a channel structure on the sidewall of the channel hole and being in electrical contact with the epitaxial layer through the expanded opening.

In some embodiments, forming the alternating dielectric stack comprises: forming at least 32 dielectric layer pairs stacked in a vertical direction, wherein each dielectric layer pair includes a first dielectric layer and a second dielectric layer that is different from the first dielectric layer. In some embodiments, forming the alternating dielectric stack comprises: forming at least 32 dielectric layer pairs stacked in a vertical direction, wherein each dielectric layer pair includes a silicon oxide layer and a silicon nitride layer.

In some embodiments, forming the functional layer comprises: forming a barrier layer on the sidewall of the channel hole to block an outflow of electronic charges during operation; forming a storage layer on a surface of the barrier layer to store electronic charges during operation; and forming a tunneling layer on a surface of the storage layer to tunnel electronic charges during operation.

In some embodiments, forming the protecting layer comprises: forming a first channel layer covering the functional layer; and forming a mask layer covering the first channel structure.

In some embodiments, removing the portions of the functional layer and the protecting layer to form the opening comprises: performing a punch etch to remove the portions of the functional layer and the protecting layer that are laterally extending on a top surface of the epitaxial layer. In some embodiments, performing the punch etch comprises: removing a portion of the epitaxial layer to form a recess.

In some embodiments, expanding the opening laterally comprises: performing a wet etch to further remove a portion of the functional layer that is laterally extending on a top surface of the epitaxial layer, such that a first diameter of the expanded opening is larger than a second diameter of the recess in the epitaxial layer.

In some embodiments, expanding the opening laterally further comprises: removing the mask layer during the wet etch while keeping the first channel layer.

In some embodiments, the method further comprises: before forming the channel structure, removing the protecting layer.

In some embodiments, forming the channel structure comprises: forming a second channel layer on the first channel layer and fill the expanded opening and the recess, wherein the channel structure includes the first channel layer and the second channel layer.

In some embodiments, the method further comprises: replacing the second dielectric layers in the alternating dielectric stack with conductor layers.

Another aspect of the present disclosure provides a three-dimensional (3D) memory device, comprising: an alternating conductor/dielectric stack on a substrate; a channel hole penetrating the alternating dielectric stack; an epitaxial layer on a bottom of the channel hole and in contact with the substrate; a functional layer covering a sidewall of the channel hole; and a channel structure covering the functional layer, and being in electrical contact with the epitaxial layer through a top surface of the epitaxial layer as well as a sidewall and a bottom surface of a recess in the epitaxial layer.

In some embodiments, the alternating conductor/dielectric stack comprises: at least 32 conductor/dielectric layer pairs stacked in a vertical direction, wherein each conductor/dielectric layer pair includes a conductor layer and a dielectric layer. In some embodiments, the alternating conductor/dielectric stack comprises: at least 32 conductor/dielectric layer pairs stacked in a vertical direction, wherein each conductor/dielectric layer pair includes a tungsten layer and a silicon oxide layer.

In some embodiments, the functional layer comprises: a barrier layer on the sidewall of the channel hole configured to block an outflow of electronic charges; a storage layer on a surface of the barrier layer configured to store electronic charges during operation of the 3D memory device; and a tunneling layer on a surface of the storage layer configured to tunnel electronic charges.

In some embodiments, the channel structure comprises: a first channel layer covering the functional layer; and a second channel layer covering the first channel structure and being in electric contact with the epitaxial layer. In some embodiments, a material of the first channel layer is different from a material of the second channel layer.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming an alternating dielectric stack on a substrate;
    forming a channel hole penetrating the alternating dielectric stack to expose a surface of the substrate;
    forming an epitaxial layer on a bottom of the channel hole;
    forming a functional layer covering a sidewall of the channel hole and a top surface of the epitaxial layer;
    forming a protecting layer covering the functional layer on the sidewall and the bottom of the channel hole;
    removing portions of the functional layer and the protecting layer on the top surface of the epitaxial layer to form an opening to expose a surface of the epitaxial layer;
    expanding the opening laterally, by removing portions of the functional layer on the top surface of the epitaxial layer and the protecting layer on the sidewall of the channel hole, to increase an exposed area of the epitaxial layer at the bottom of the channel hole, wherein an axial section of the remaining protecting layer includes two L-shaped portions; and
    forming a channel structure on the sidewall of the channel hole and being in electrical contact with the epitaxial layer through the expanded opening.

2. The method of claim 1, wherein forming the alternating dielectric stack comprises:
    forming at least 32 dielectric layer pairs stacked in a vertical direction, wherein each dielectric layer pair includes a first dielectric layer and a second dielectric layer that is different from the first dielectric layer.

3. The method of claim 1, wherein forming the alternating dielectric stack comprises:
    forming at least 32 dielectric layer pairs stacked in a vertical direction, wherein each dielectric layer pair includes a silicon oxide layer and a silicon nitride layer.

4. The method of claim 1, wherein forming the functional layer comprises:
    forming a barrier layer on the sidewall of the channel hole to block an outflow of electronic charges during operation;
    forming a storage layer on a surface of the barrier layer to store electronic charges during operation; and
    forming a tunneling layer on a surface of the storage layer to tunnel electronic charges during operation.

5. The method of claim 1, wherein forming the protecting layer comprises:
   forming a first channel layer covering the functional layer; and
   forming a mask layer covering the first channel structure.

6. The method of claim 5, wherein removing the portions of the functional layer and the protecting layer to form the opening comprises:
   performing a punch etch to remove the portions of the functional layer and the protecting layer that are laterally extending on a top surface of the epitaxial layer.

7. The method of claim 6, wherein performing the punch etch comprises:
   removing a portion of the epitaxial layer to form a recess.

8. The method of claim 7, wherein expanding the opening laterally comprises:
   performing a wet etch to further remove a portion of the functional layer that is laterally extending on a top surface of the epitaxial layer, such that a first diameter of the expanded opening is larger than a second diameter of the recess in the epitaxial layer.

9. The method of claim 8, wherein expanding the opening laterally further comprises:
   removing the mask layer during the wet etch while keeping the first channel layer.

10. The method of claim 1, further comprising:
    before forming the channel structure, removing the protecting layer.

11. The method of claim 9, wherein forming the channel structure comprises:
    forming a second channel layer on the first channel layer and filling the expanded opening and the recess, wherein the channel structure includes the first channel layer and the second channel layer.

12. The method of claim 2, further comprising:
    replacing the second dielectric layers in the alternating dielectric stack with conductor layers.

13. The method of claim 5, wherein forming the channel structure comprises:
    removing the first channel layer to expose the sidewall of the functional layer; and
    forming a second channel layer on the sidewall of the functional layer and filling the expanded opening and the recess.

* * * * *